(12) United States Patent
Takahashi et al.

(10) Patent No.: US 9,179,551 B2
(45) Date of Patent: Nov. 3, 2015

(54) METHOD FOR PRODUCING PRINTED-WIRING BOARD

(71) Applicant: MITSUBISHI GAS CHEMICAL COMPANY, INC., Tokyo (JP)

(72) Inventors: Kenichi Takahashi, Kanagawa (JP); Kazuhiko Ikeda, Kanagawa (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 14/332,798

(22) Filed: Jul. 16, 2014

(65) Prior Publication Data

US 2015/0034590 A1 Feb. 5, 2015

(30) Foreign Application Priority Data

Aug. 1, 2013 (JP) ................................. 2013-160643

(51) Int. Cl.
| | |
|---|---|
| *H05K 3/06* | (2006.01) |
| *H01B 13/00* | (2006.01) |
| *H05K 3/10* | (2006.01) |
| *C23F 1/18* | (2006.01) |
| *C25D 5/02* | (2006.01) |
| *C23C 18/16* | (2006.01) |
| *C23C 18/38* | (2006.01) |
| *H05K 3/18* | (2006.01) |

(52) U.S. Cl.
CPC ............ *H05K 3/067* (2013.01); *C23C 18/1653* (2013.01); *C23C 18/1689* (2013.01); *C23C 18/38* (2013.01); *C23F 1/18* (2013.01); *C25D 5/022* (2013.01); *H05K 3/108* (2013.01); *H05K 3/185* (2013.01)

(58) Field of Classification Search
CPC .................................. H05K 3/067; H05K 1/09
USPC ............. 216/13, 83, 100; 204/192.1; 205/183
See application file for complete search history.

(56) References Cited

U.S. PATENT DOCUMENTS

| | | | |
|---|---|---|---|
| 6,666,987 B1 | 12/2003 | Morikawa et al. | |
| 2002/0128164 A1* | 9/2002 | Hara et al. ..................... | 510/175 |
| 2003/0186175 A1* | 10/2003 | Ikemoto et al. ............... | 430/331 |

(Continued)

FOREIGN PATENT DOCUMENTS

| | | |
|---|---|---|
| JP | 09-152721 | 6/1997 |
| JP | 2000-64067 | 2/2000 |

(Continued)

*Primary Examiner* — Shamim Ahmed
(74) *Attorney, Agent, or Firm* — Greenblum & Bernstein, P.L.C.

(57) ABSTRACT

The present invention provides a method for producing a printed-wiring board in a semi-additive process, comprising the steps of: providing a chemical copper plating 4 on an insulation layer 3 or forming a copper thin film on the insulation layer 3 using a sputtering method; subjecting the obtained copper surface 4 to a roughening treatment using an etching solution containing 0.1 to 3% by mass of hydrogen peroxide, 0.3 to 5% by mass of sulfuric acid, 0.1 to 3 ppm of halogen ion and 0.003 to 0.3% by mass of tetrazoles; attaching a dry film resist 5 to the copper surface 4 after the roughening treatment to perform exposure and development and providing an electrolytic copper plating 7 to an opening 6 after the exposure; and subjecting the remaining dry film resist to a stripping treatment using a resist stripping liquid containing 0.5 to 20% by mass of monoethanolamine, 0.2 to 10% by mass of quaternary ammonium hydroxide, 0.01 to 10% by mass of ethylene glycols and 0.01 to 0.5% by mass of azoles.

6 Claims, 4 Drawing Sheets

(56) References Cited

U.S. PATENT DOCUMENTS

| | | |
|---|---|---|
| 2005/0061202 A1 | 3/2005 | Hosomi et al. |
| 2011/0114369 A1* | 5/2011 | Lee et al. ............... 174/252 |
| 2013/0011734 A1* | 1/2013 | Arai et al. .............. 429/211 |
| 2013/0099260 A1* | 4/2013 | Kim et al. ............... 257/88 |
| 2014/0030425 A1* | 1/2014 | Owei et al. .............. 427/97.1 |

FOREIGN PATENT DOCUMENTS

| | | |
|---|---|---|
| JP | 2002-62668 | 2/2002 |
| JP | 2002-289569 | 10/2002 |
| JP | 2003-3283 | 1/2003 |
| JP | 2005-187945 | 7/2005 |
| JP | 2005-213526 | 8/2005 |
| JP | 2009-019270 | 1/2009 |

* cited by examiner

METHOD FOR PRODUCING PRINTED-WIRING BOARD

TECHNICAL FIELD

The present invention relates to a method for producing a printed-wiring board to be used for electrical devices, electronic devices, etc., and specifically relates to a method for forming a micro wiring in a semi-additive process.

BACKGROUND ART

Recently, with miniaturization, reduction in weight and sophistication of electronic devices, refinement and density increase of copper wiring have been strongly desired for printed-wiring boards.

A semi-additive process is one of production methods for forming a micro wiring. According to this method for forming a wiring, a metal layer called a seed layer is formed on an insulation layer, a plating resist layer is formed on the surface thereof, and after that, exposure and development are performed to form a resist pattern. After that, an electrolytic copper plating is provided to an opening, the resist is stripped, and the seed layer is removed by etching to form a copper wiring.

Conventionally, the surface of the insulation layer is subjected to the roughening treatment to form concavity and convexity chemically or physically, and the adhesion between the insulation layer and the chemical copper plating as the seed layer is ensured by the physical (anchor) effect. The thickness of the chemical copper plating is generally 0.5 to 1 µm or less. Therefore, since the surface of the chemical copper plating is formed in conformity to concavity and convexity of the insulation layer, regarding the surface roughness, the arithmetic average roughness Ra is large (0.4 to 1 µm). Recently, the width of copper wiring has been decreased to 10 µm, and moreover, decrease to several µm has been studied for next-generation products. However, the surface of the conventional chemical copper plating that is formed on the insulation layer coarsely roughened is markedly uneven, and therefore, in the exposure process for a dry film resist, it is difficult to form a fine pattern with a wiring width of less than 10 µm because of reduction in the resolution due to light scattering.

Recently, for micro wiring, an insulation layer material, which has a surface roughened at a level lower than conventional insulation layer materials and can ensure adhesion to the chemical copper plating, has been produced. The insulation layer material ensures adhesion to the chemical copper plating with the physical effect and chemical effect of low-level roughening. The surface of the insulation layer to which the chemical copper plating is applied is almost flat and smooth without concavity and convexity. In the case of the surface of chemical copper plating, adhesion to a dry film resist material is insufficient, and it is impossible to form a pattern.

Further, for the production of micro wiring, there is a case where a copper film formed by the sputtering method (sputtered copper) is formed on the seed layer instead of the chemical copper plating (thickness of sputtered copper: 0.5 to 0.7 µm). The surface of the sputtered copper is flatter and smoother than the chemical copper plating, and it is impossible to obtain sufficient adhesion to a dry film resist material, and therefore, it is difficult to form a pattern.

As conventional roughening agents for copper, for example, a surface treatment agent containing hydrogen peroxide, mineral acid, azoles, silver ion and halogen ion (Patent Document 1), an etching solution containing oxoacid, peroxide, azoles and halide (Patent Document 2), a surface roughening treatment solution containing hydrogen peroxide, sulfuric acid, benzotriazols and chloride ion (Patent Document 3), a micro-etching agent containing sulfuric acid, peroxide, tetrazole and a metal ion having a potential nobler than that of copper (Patent Document 4), and a surface roughening agent containing sulfuric acid, hydrogen peroxide, aminotetrazole, a tetrazole compound other than aminotetrazole and a phosphonic acid-based chelating agent (Patent Document 5) are disclosed.

In a semi-additive process, a resist pattern is formed, an electrolytic copper plating is provided to an opening thereof, and at the time of the resist stripping step, when the width of a resist pattern is smaller than 10 µm, the resist does not sufficiently swell with a conventional resist stripping liquid or the like containing sodium hydroxide that allows the dry film resist to swell and to be stripped, because the space of the adjacent resist pattern is narrow. For this reason, stripping is insufficient. Further, dry film resist materials for micro wiring formation have been improved to be a low-swelling type having a high resolution, and therefore, such resists cannot be stripped with conventional stripping liquids.

As resist stripping liquids containing an organic compound, a stripping agent made of an aqueous solution containing quaternary ammonium hydroxide, water-soluble amine and hydroxylamines (Patent Document 6), a stripping agent made of an aqueous solution containing ammonium fluoride, a polar organic solvent and epoxy polyamide (Patent Document 7), a resist stripping liquid containing alkanolamine, diethylhydroxylamine, diethylene glycol monoalkyl ether, sugars and water (Patent Document 8) and the like are disclosed.

PRIOR ART DOCUMENTS

Patent Documents

[Patent Document 1] Japanese Laid-Open Patent Publication No. 2003-3283
[Patent Document 2] Japanese Laid-Open Patent Publication No. 2000-64067
[Patent Document 3] Japanese Laid-Open Patent Publication No. 2005-213526
[Patent Document 4] Japanese Laid-Open Patent Publication No. 2005-187945
[Patent Document 5] Japanese Laid-Open Patent Publication No. 2009-19270
[Patent Document 6] Japanese Laid-Open Patent Publication No. 2002-62668
[Patent Document 7] Japanese Laid-Open Patent Publication No. 2002-289569
[Patent Document 8] Japanese Laid-Open Patent Publication No. H09-152721

SUMMARY OF THE INVENTION

Problems to be Solved by the Invention

According to the experiment made by the present inventors, when the surface of the chemical copper plating or sputtered copper is roughened using a conventional copper surface roughening liquid like those in Patent Documents 1-5, the amount of dissolution of copper may be increased or the surface roughness Rz after dissolution (maximum roughness) may be increased by 1 µm or more, and since this is equal to or more than the thickness of the chemical copper plating or sputtered copper, defects such as disconnection may occur.

Further, when the dry film resist is stripped using the stripping liquid disclosed in Patent Documents 6-8, stripping property of the dry film resist for improved micro wiring formation is insufficient.

The problems of the present invention are to improve adhesion between the surface of the chemical copper plating or sputtered copper that is a seed layer and the dry film resist in the semi-additive process in the production of printed-wiring boards and to provide a method for forming a micro wiring in which stripping property of the dry film resist is good and highly-reliable.

Means for Solving the Problems

The present inventors found that, by subjecting the surface of a chemical copper plating or the surface of a copper film formed by the sputtering method (sputtered copper), which is a seed layer in a semi-additive process in the production of a printed-wiring board, to a fine unevenness roughening with a specific etching solution, the adhesion between the surface of the chemical copper plating or the surface of the sputtered copper and a dry film resist is improved. The present inventors further found that, by stripping the dry film resist using a specific resist stripping liquid with a low damage to a copper wiring, the dry film resist can be stripped without residue and a printed-wiring board having a micro wiring can be produced. Thus the present invention was achieved.

Specifically, the present invention is as follows:

<1> A method for producing a printed-wiring board in a semi-additive process, comprising the steps of:

providing a chemical copper plating on an insulation layer or forming a copper thin film on the insulation layer using a sputtering method;

subjecting the obtained copper surface to a roughening treatment using an etching solution containing 0.1 to 3% by mass of hydrogen peroxide, 0.3 to 5% by mass of sulfuric acid, 0.1 to 3 ppm of halogen ion and 0.003 to 0.3% by mass of tetrazoles;

attaching a dry film resist to the copper surface after the roughening treatment to perform exposure and development and providing an electrolytic copper plating to an opening after the exposure and development; and subjecting the remaining dry film resist to a stripping treatment using a resist stripping liquid containing 0.5 to 20% by mass of monoethanolamine, 0.2 to 10% by mass of quaternary ammonium hydroxide, 0.01 to 10% by mass of ethylene glycols and 0.01 to 0.5% by mass of azoles.

<2> The method for producing a printed-wiring board according to item <1>, wherein the specific surface area of the copper surface after the roughening treatment (with the proviso that the specific surface area of the copper surface is an surface area of the copper surface per an unit area of 5 μm×5 μm and the value of the area is measured by using a scanning tunneling microscope (30,000×)) is 1.2 to 2.0.

<3> The method for producing a printed-wiring board according to item <1> or <2>, wherein the copper surface roughness (Ra) before and after the roughening treatment (with the proviso that the value of the copper surface roughness is measured by using a scanning tunneling microscope (30,000×)) is 0.1 to 0.3 μm.

<4> The method for producing a printed-wiring board according to any one of items <1> to <3>, wherein the tetrazoles in the etching solution are at least one selected from the group consisting of 1H-tetrazole, 1-methyltetrazole, 5-methyltetrazole, 5-aminotetrazole, 5-mercapto-1-methyltetrazole and 1,5-dimethyltetrazole.

<5> The method for producing a printed-wiring board according to any one of items <1> to <4>, wherein the quaternary ammonium hydroxide in the resist stripping liquid is at least one selected from the group consisting of tetramethylammonium hydroxide, tetraethylammonium hydroxide and trimethyl(2-hydroxyethyl)ammonium hydroxide.

<6> The method for producing a printed-wiring board according to any one of items <1> to <5>, wherein the ethylene glycols in the resist stripping liquid are at least one selected from the group consisting of ethylene glycol monophenyl ether and diethylene glycol monophenyl ether.

<7> The method for producing a printed-wiring board according to any one of items <1> to <6>, wherein the azoles in the resist stripping liquid are at least one selected from the group consisting of 5-aminotetrazole and 1,2,4-triazole.

Advantageous Effect of the Invention

According to the method for producing a printed-wiring board of the present invention, in the production of a printed-wiring board by means of a semi-additive process that was conventionally difficult, by subjecting a chemical copper plating or a copper film formed by the sputtering method (sputtered copper), which is a seed layer, to a fine unevenness roughening with a low etching amount and a low roughness degree, it is possible to suppress reduction in the resolution due to light scattering in the exposure process, and it is also possible to improve adhesion to a dry film resist after the development and to strip the dry film resist without residue, thereby forming a micro wiring. Therefore, the method has a great deal of potential in industry.

EMBODIMENTS FOR CARRYING OUT THE INVENTION

The method for producing a printed-wiring board of the present invention will be described using FIGS. 6 and 7, but the present invention is not limited to the embodiments in FIGS. 6 and 7.

Figure 6:
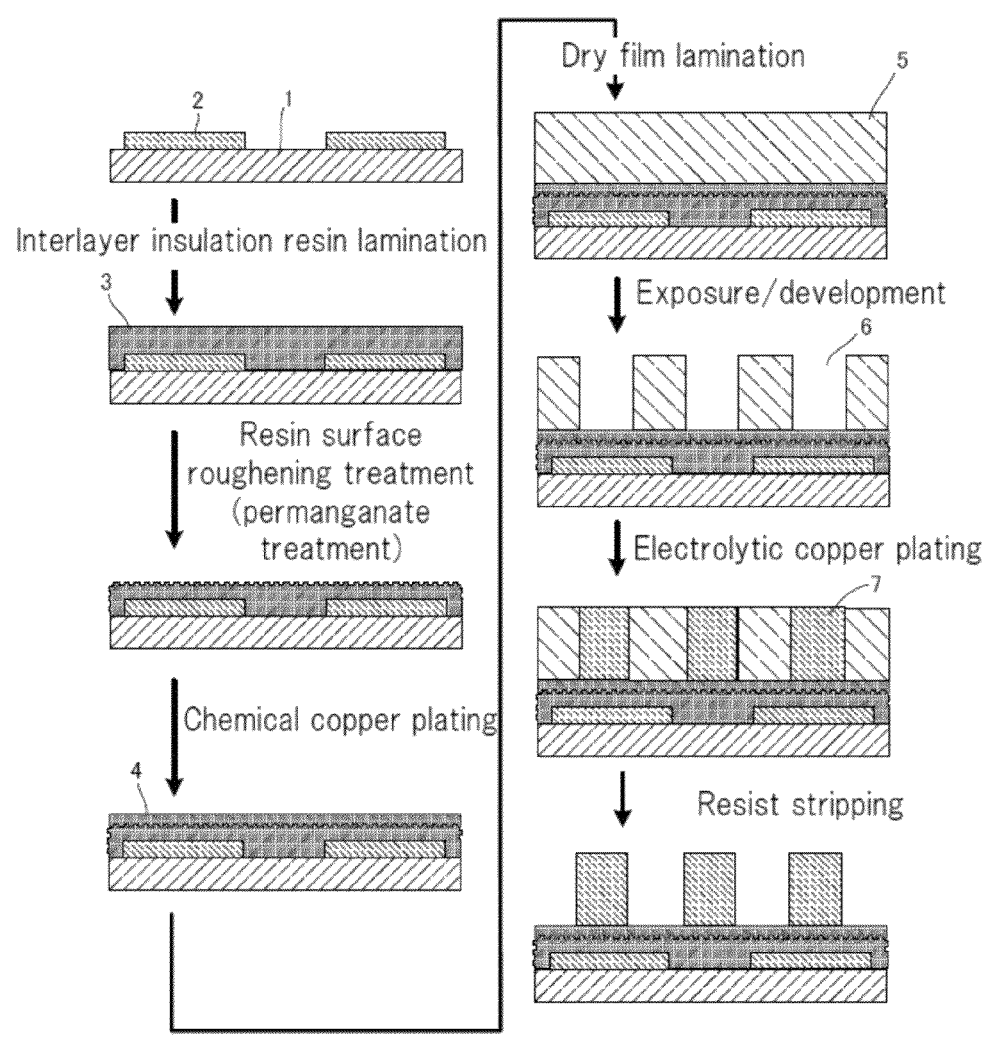
FIG. 6 is a schematic view showing an example of the method for producing a printed-wiring board of the present invention.

Usually, as shown in FIG. 6, a copper wiring 2 is formed on a core (insulation layer) 1, and an insulation layer 3 is formed to cover the copper wiring 2. Further, the surface of the insulation layer 3 is preferably subjected to a roughening treatment using permanganate or the like. Subsequently, a chemical copper plating 4 is provided on the insulation layer 3, or a copper thin film is formed on the insulation layer 3 using the sputtering method. Further, the formed copper surface 4 is subjected to the roughening treatment using a specific etching solution, which is one of the features of the present invention. Note that the roughening treatment itself for the copper surface 4 using the etching solution is a novel idea and is not prior art.

Subsequently, a dry film resist 5 is attached to the copper surface 4 after the roughening treatment, and exposure and development are performed. An opening 6 is formed by the exposure and development of the dry film resist 5. Further, an electrolytic copper plating 7 is provided to the opening 6, and the remaining dry film resist 5 is subjected to a stripping treatment using a specific resist stripping liquid, which is one of the features of the present invention. In this way, a micro wiring can be formed.

Figure 7:
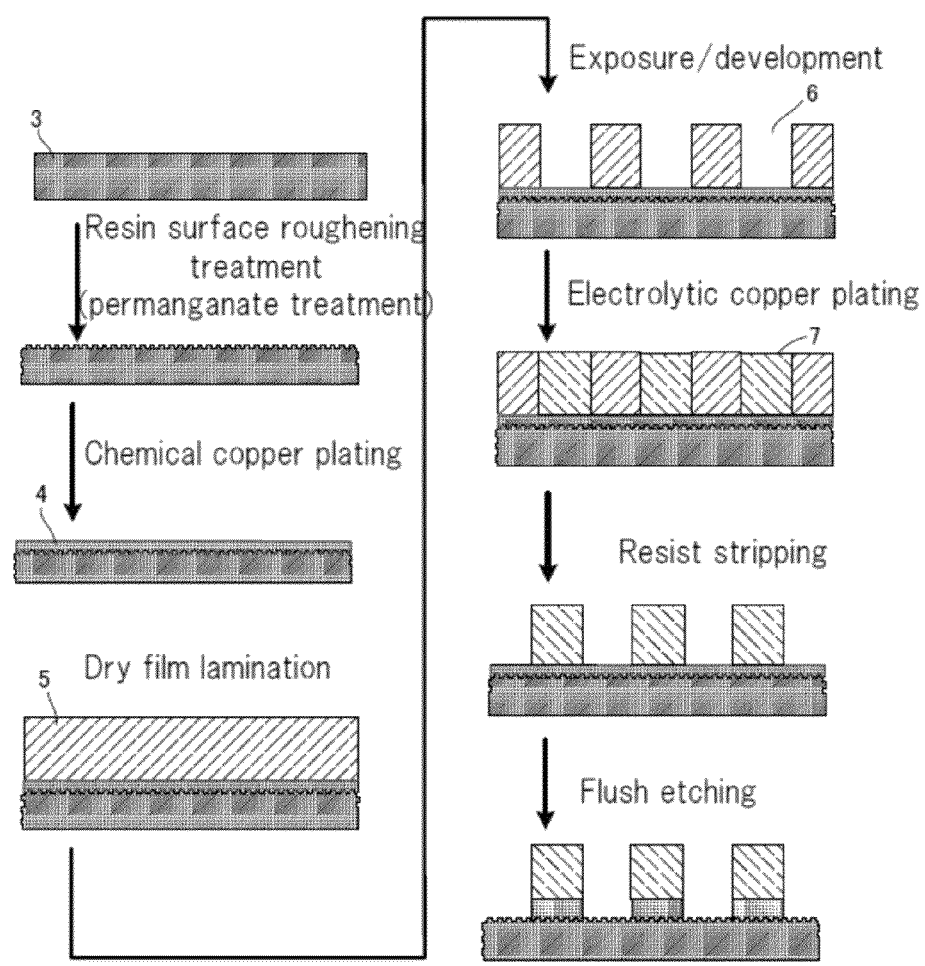
FIG. 7 is a schematic view showing another example of the method for producing a printed-wiring board of the present invention.

In the embodiment in FIG. 7, an insulation layer 3 is used as a starting material. The surface of the insulation layer 3 is preferably subjected to the roughening treatment using permanganate or the like. Subsequently, a chemical copper plating 4 is provided on the insulation layer 3, or a copper thin film is formed on the insulation layer 3 using the sputtering method. Further, the formed copper surface 4 is subjected to the roughening treatment using a specific etching solution, which is one of the features of the present invention. As described above, the roughening treatment itself for the copper surface 4 using the etching solution is a novel idea and is not prior art.

Subsequently, a dry film resist 5 is attached to the copper surface 4 after the roughening treatment, and exposure and development are performed. An opening 6 is formed by the exposure and development of the dry film resist 5. Further, an electrolytic copper plating 7 is provided to the opening 6, and the remaining dry film resist 5 is subjected to the stripping treatment using a specific resist stripping liquid, which is one of the features of the present invention. The chemical copper plating 4 on the portion which contacted with the stripped dry film resist 5 is removed by flush etching, thereby forming a micro wiring.

The etching solution to be used in the present invention preferably contains hydrogen peroxide, sulfuric acid, halogen ion and tetrazoles. The concentration of hydrogen peroxide is 0.1 to 3% by mass, preferably 0.1 to 2% by mass, more preferably 0.2 to 1.5% by mass, and particularly preferably 0.2 to 1% by mass. When the concentration of hydrogen peroxide is 0.1 to 3% by mass, a good dissolution rate of copper is obtained and it is economically excellent.

The concentration of sulfuric acid is 0.3 to 5% by mass, preferably 0.4 to 4% by mass, more preferably 0.5 to 3% by mass, and particularly preferably 0.8 to 2.5% by mass. When the concentration of sulfuric acid is 0.3 to 5% by mass, a good dissolution rate of copper is obtained and it is economically excellent.

The halogen ion is considered to have the effect of roughening the copper surface, and this provides good adhesion between the copper surface and the dry film resist material. Examples of the halogen ion include fluorine ion, chloride ion, bromine ion and iodine ion. Among them, chloride ion and bromine ion are preferred, and chloride ion is particularly preferred. The concentration of the halogen ion is 0.1 to 3 ppm, preferably 0.3 to 3 ppm, and particularly preferably 0.5 to 2 ppm.

When tetrazoles are used in combination with the halogen ion, the effect of fine unevenness roughening the copper surface is exerted thereby, and it improves adhesion between the copper surface and the dry film resist material. Among tetrazoles, at least one selected from the group consisting of 1H-tetrazole, 1-methyltetrazole, 1-ethyltetrazole, 5-methyltetrazole, 5-ethyltetrazole, 5-n-propyltetrazole, 5-aminotetrazole, 5-mercaptotetrazole, 5-mercapto-1-methyltetrazole, 1,5-dimethyltetrazole, 1,5-diethyltetrazole, 1-methyl-5-ethyltetrazole, 1-ethyl-5-methyltetrazole, 1-isopropyl-5-methyltetrazole and 1-cyclohexyl-5-methyltetrazole is preferred. 1H-tetrazole, 1-methyltetrazole, 5-methyltetrazole, 5-ethyltetrazole, 5-aminotetrazole, 5-mercapto-1-methyltetrazole, 1,5-dimethyltetrazole, 1,5-diethyltetrazole and 1-ethyl-5-methyltetrazole are more preferred, and 1H-tetrazole, 1-methyltetrazole, 5-methyltetrazole, 5-aminotetrazole, 5-mercapto-1-methyltetrazole and 1,5-dimethyltetrazole are particularly preferred. The concentration of tetrazoles is 0.003 to 0.3% by mass, preferably 0.005 to 0.25% by mass, and particularly preferably 0.01 to 0.2% by mass.

The resist stripping liquid, which is another feature of the present invention, preferably contains monoethanolamine, quaternary ammonium hydroxide, ethylene glycols and azoles. The concentration of monoethanolamine is 0.5 to 20% by mass, preferably 1 to 15% by mass, more preferably 2 to 10% by mass, and particularly preferably 3 to 8% by mass. When the concentration of monoethanolamine is 0.5 to 20% by mass, good resist stripping property is obtained and it is economically excellent.

The quaternary ammonium hydroxide fines pieces of stripped resist to suppress generation of resist stripping residue. Among quaternary ammonium hydroxides, at least one selected from the group consisting of tetramethylammonium hydroxide, tetraethylammonium hydroxide, tetrapropylammonium hydroxide, trimethyl(2-hydroxyethyl)ammonium hydroxide and triethyl(2-hydroxyethyl)ammonium hydroxide is preferred. Tetramethylammonium hydroxide, tetraethylammonium hydroxide and trimethyl(2-hydroxyethyl) ammonium hydroxide are more preferred. The concentration of the quaternary ammonium hydroxide is 0.2 to 10% by mass, preferably 0.5 to 8% by mass, more preferably 0.8 to 5% by mass, and particularly preferably 1 to 4% by mass. When the concentration of the quaternary ammonium hydroxide is 0.2 to 10% by mass, good resist stripping property is obtained and it is economically excellent.

Ethylene glycols are considered to improve permeability to resist materials and suppress generation of resist stripping residue. Among the ethylene glycols, ethylene glycol monophenyl ether and diethylene glycol monophenyl ether are preferred. The concentration of the ethylene glycols is 0.01 to 10% by mass, preferably 0.05 to 8% by mass, more preferably 0.1 to 5% by mass, and particularly preferably 0.5 to 3% by mass. When the concentration of the ethylene glycols is 0.01 to 10% by mass, good resist stripping property is obtained and it is economically excellent.

Azoles are effective as corrosion inhibitors for copper wiring. Among the azoles, 5-aminotetrazole and 1,2,4-triazole are preferred. The concentration of the azoles is 0.01 to 0.5% by mass, preferably 0.02 to 0.4% by mass, more preferably 0.03 to 0.3% by mass, and particularly preferably 0.05 to 0.2% by mass. When the concentration of the azoles is 0.01 to 0.5% by mass, good corrosion preventive property is obtained and it is economically excellent.

Since the film thickness of the chemical copper plating or sputtered copper for formation of wiring in the semi-additive process is thin (0.5 to 1 μm), defects such as disconnection tend to easily occur. In order to prevent this, the surface roughness (average roughness: Ra value) of the chemical copper plating or sputtered copper is preferably 0.35 μm or less, more preferably 0.3 μm or less, and particularly preferably 0.25 μm or less. When the upper limit is more than 0.35 μm, it may cause generation of disconnection.

The lower limit is preferably 0.1 μm or more, more preferably 0.12 μm or more, and particularly preferably 0.15 μm or more. When the lower limit is less than 0.1 μm, the roughened form is insufficient and unfavorable. Note that the value of the copper surface roughness (Ra value) is measured by using a scanning tunneling microscope (30,000×).

The dissolution rate of the chemical copper plating or sputtered copper varies depending on various conditions, but for example, under the treatment condition of 30° C., the dissolution rate is preferably 0.05 to 2 μm/min., more preferably 0.1 to 1.5 μm/min., and particularly preferably 0.2 to 1 μm/min.

The operating temperature of the etching solution to be used in the present invention is not particularly limited, but is preferably 20 to 50° C., more preferably 25 to 40° C., and even more preferably 25 to 35° C. The higher the operating temperature is, the higher the dissolution rate of copper is, but when the temperature exceeds 50° C., it is unfavorable because excessive decomposition of hydrogen peroxide occurs.

The treatment time of the etching solution to be used in the present invention is not particularly limited, but is preferably 1 to 600 seconds, more preferably 5 to 300 seconds, even more preferably 10 to 180 seconds, and particularly preferably 15 to 120 seconds. However, the treatment time is suitably selected according to various conditions such as the state of the metal surface, the concentration of the etching solution, temperature and the treatment method.

The treatment method using the etching solution to be used in the present invention is not particularly limited, but is carried out by means of immersion, spray or the like. Further, the treatment time is suitably selected according to the thickness of copper to be dissolved.

The sputtered copper to be subjected to etching in the present invention is a copper thin film formed as follows: an inert gas (mainly argon) is introduced in a vacuum and a minus voltage is applied to a target (a plate-like film-forming material) to generate glow discharge to ionize inert gas atoms; gas ions are allowed to strongly impact the surface of the target at high speed to sputter particles (atoms and molecules) of the film-forming material constituting the target, and the particles are allowed to strongly attach to and deposit on the surface of a base material/substrate.

The surface area of copper [μm$^2$] can be calculated by observation of the copper surface using a scanning tunneling microscope. Specifically, the surface of copper is observed using a scanning tunneling microscope to obtain its three-dimensional shape data, and then the surface area of copper [μm$^2$] is calculated based on this three-dimensional shape data.

The magnification of the scanning tunneling microscope for observation of the copper surface is, for example, 30,000-fold.

The specific surface area of copper is equal to a value obtained by dividing the surface area, which is obtained by observing with a scanning tunneling microscope and taking concavity and convexity in a predetermined area of the copper surface into consideration, by the surface area, which is obtained when assuming that the area is flat. For example, it is a value obtained by dividing the surface area, which is obtained by taking concavity and convexity in an area (5 μm×5 μm) of the copper surface into consideration, by the surface area, which is obtained when assuming that the area is flat (i.e., 5 μm×5 μm=25 μm$^2$). The specific surface area of the copper surface after the roughening treatment (it is an surface area of the copper surface per an unit area of 5 μm×5 μm and the value of the area is measured by using a scanning tunneling microscope (30,000×)) is preferably 1.2 to 2.0, and more preferably 1.3 to 1.8. When the specific surface area of the copper surface after the roughening treatment is 1.2 to 2.0, the number of very small convex portions on the copper surface is increased to provide a good anchor effect for a dry film, resulting in the improvement of adhesion, and therefore it is preferable.

The value of the specific surface area of copper is obtained by taking concavity and convexity of the copper surface into consideration. Accordingly, there is a tendency that the more delicate the copper surface is, the larger the specific surface area of copper is. The expression "delicate" as used herein refers to a state in which each convex portion on the copper surface is very small and the convex portions are closely-spaced.

The scanning tunneling microscope is a type of microscope in which a tunnel current flowing between a metal probe and a sample is detected. When a sharpened metal probe made of platinum, tungsten or the like is moved closer to a sample and then a small bias voltage is applied between them, a tunnel current is flowed by the tunnel effect. By scanning with the probe with the tunnel current being maintained at a constant level, the surface shape of the sample can be observed at the atomic level.

EXAMPLES

Hereinafter, the present invention will be specifically described by way of examples and comparative examples. However, the present invention is not limited to these examples.

Measurement of Surface Area

Observation was carried out using a scanning tunneling microscope (SII Nano Technology Inc., L-trace II/NanoNavi II Station) (30,000×).

Method for measuring the amount of dissolution of copper: calculation was carried out by the mass method using the following formula:

The amount of dissolution=(the mass before treatment−the mass after treatment)/(treatment surface×8.96)

Example 1

Roughening Treatment Process

A substrate of chemical copper plating (size: 15 cm×15 cm, thickness of plating: 0.5 μm) was subjected to a spray treatment at a liquid temperature of 30° C. and a spray pressure of 0.1 MPa for 30 seconds using an etching solution prepared with 0.3% by mass of hydrogen peroxide, 1.5% by mass of sulfuric acid, 0.1% by mass of 5-methyltetrazole, 1 ppm of chloride ion and the remaining amount of water. As a result, the amount of dissolution of copper was 0.2 μm. The specific amount of dissolution of copper was calculated from the difference in mass of the substrate before and after the roughening treatment.

Figure 1:
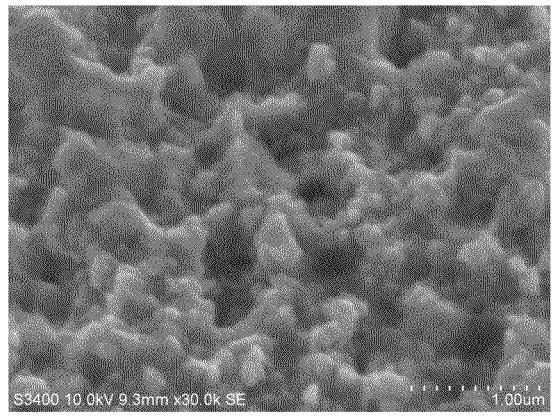
FIG. 1 is an electron microscope photograph of the copper surface of Example 1 (30,000×).

Next, with respect to the surface of chemical copper plating after etching, the surface area in an area of 5 μm×5 μm was measured using a scanning tunneling microscope (30,000×). As a result, the surface area of the chemical copper plating was 38 [μm$^2$]. The specific surface area was 38 [μm$^2$]/25 [μm$^2$]=1.52. Further, the copper surface roughness (Ra) was 0.17 μm. An electron microscope photograph of the copper surface (30,000×) is shown in FIG. 1.

<Evaluation of Adhesion of Dry Film>

Next, the copper surface after the roughening treatment was laminated with a dry film resist (Hitachi Chemical Co., Ltd.), and exposure was performed. Using a crosshatch guide, 11 lines with 1 mm intervals were scratched on the dry film resist to form a grid (10×10=100). An adhesive tape was applied to the grid and peeled off into the vertical direction. The pieces of dry film resist which adhered to the adhesive tape were visually observed, and the adhesion was evaluated. The evaluation results are shown in Table 1.

Evaluation Criteria for Adhesion (Visual Observation)

E: the state in which all the 100 squares of the grid remain on the substrate

G: the state in which 90 or more squares of the grid remain on the substrate

P: the state in which 60 or more and 89 or less of squares of the grid remain on the substrate F: the state in which 59 or less of squares of the grid remain on the substrate <Resist Stripping Treatment Process>

The copper surface after the above-described <Roughening treatment process> was laminated with a dry film resist (Hitachi Chemical Co., Ltd.), and exposure and development were performed. An electrolytic copper plating was provided to an opening after the exposure. Next, the spray treatment was carried out at a liquid temperature of 50° C. and a spray pressure of 0.2 MPa for 3 minutes using a resist stripping liquid prepared with 5% by mass of monoethanolamine, 1% by mass of tetramethylammonium hydroxide, 2% by mass of ethylene glycol monophenyl ether, 0.1% by mass of 5-aminotetrazole and the remaining amount of water to strip the resist. Observation was carried out using a metallographic microscope (Olympus Corporation, MX61L) (200×), and it was confirmed that the resist was completely stripped and removed. Further, the surface of the copper wiring of the conductor was observed using the metallographic microscope, and no copper corrosion (e.g., a pinhole) was seen.

Example 2

<Roughening treatment process> and <Resist stripping treatment process> were carried out in manners similar to those in Example 1, except that an etching solution was prepared with 0.5% by mass of hydrogen peroxide, 2.5% by mass of sulfuric acid, 0.05% by mass of 5-aminotetrazole, 0.05% by mass of 1,5-dimethyltetrazole, 1 ppm of chloride ion and the remaining amount of water. The surface area of the chemical copper plating was 40 [$\mu m^2$]. The specific surface area was 1.60. The copper surface roughness (Ra) was 0.20 μm. The evaluation result regarding the adhesion of the dry film is shown in Table 1, and the evaluation result regarding the dry film stripping property is shown in Table 2.

Example 3

<Roughening treatment process> and <Resist stripping treatment process> were carried out in manners similar to those in Example 1, except that an etching solution was prepared with 0.4% by mass of hydrogen peroxide, 2% by mass of sulfuric acid, 0.05% by mass of 1H-tetrazole, 0.03% by mass of 5-mercapto-1-methyltetrazole, 1 ppm of chloride ion and the remaining amount of water. The surface area of the chemical copper plating was 37 [$\mu m^2$]. The specific surface area was 1.48. The copper surface roughness (Ra) was 0.19 μm. The evaluation result regarding the adhesion of the dry film is shown in Table 1, and the evaluation result regarding the dry film stripping property is shown in Table 2.

Example 4

<Roughening treatment process> and <Resist stripping treatment process> were carried out in manners similar to those in Example 1, except that an etching solution was prepared with 0.5% by mass of hydrogen peroxide, 2.5% by mass of sulfuric acid, 0.05% by mass of 5-methyltetrazole, 0.05% by mass of 1,5-dimethyltetrazole, 3 ppm of bromine ion and the remaining amount of water. The surface area of the chemical copper plating was 39 [$\mu m^2$]. The specific surface area was 1.56. The copper surface roughness (Ra) was 0.20 μm. The evaluation result regarding the adhesion of the dry film is shown in Table 1, and the evaluation result regarding the dry film stripping property is shown in Table 2.

Comparative Example 1

Figure 2:
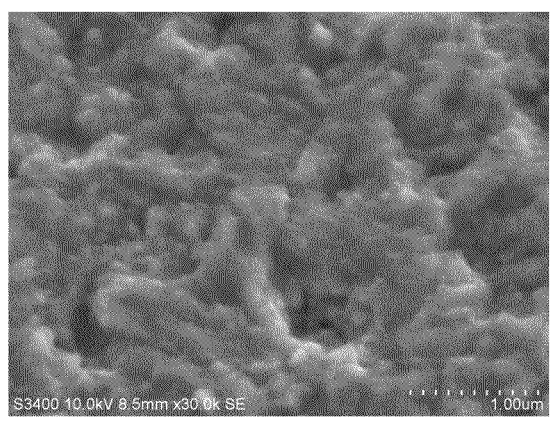
FIG. 2 is an electron microscope photograph of the copper surface of Comparative Example 1 (30,000×).
Figure 3:
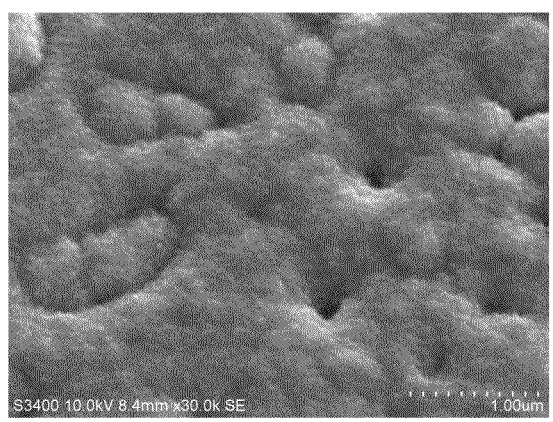
FIG. 3 is an electron microscope photograph of the untreated copper surface (30,000×).

<Roughening treatment process> was carried out in a manner similar to that in Example 1, except that an etching solution was prepared with 0.3% by mass of hydrogen peroxide, 1.5% by mass of sulfuric acid, 0.1% by mass of 5-methyltetrazole and the remaining amount of water. The surface area of the chemical copper plating was 27 [$\mu m^2$]. The specific surface area was 1.08. The copper surface roughness (Ra) was 0.22 μm. An electron microscope photograph of the copper surface (30,000×) is shown in FIG. 2. The evaluation result regarding the adhesion of the dry film is shown in Table 1. Note that since the adhesion of the dry film resist was not good, <Resist stripping treatment process> was not carried out after that.

Comparative Example 2

<Roughening treatment process> was carried out in a manner similar to that in Example 1, except that an etching solution was prepared with 0.3% by mass of hydrogen peroxide, 1.5% by mass of sulfuric acid, 1 ppm of chloride ion and the remaining amount of water. The surface area of the chemical copper plating was 26 [$\mu m^2$]. The specific surface area was 1.04. The copper surface roughness (Ra) was 0.14 μm. The evaluation result regarding the adhesion of the dry film is shown in Table 1. Note that since the adhesion of the dry film resist was not good, <Resist stripping treatment process> was not carried out after that.

Comparative Example 3

<Roughening treatment process> was carried out in a manner similar to that in Example 1, except that an etching solution (the product used in Example 1 of Patent Document 1) was prepared with 2% by mass of hydrogen peroxide, 9% by mass of sulfuric acid, 0.3% by mass of 5-aminotetrazole, 0.2 ppm of silver ion, 0.2 ppm of chloride ion and the remaining amount of water. The surface area of the chemical copper plating was 28 [$\mu m^2$]. The specific surface area was 1.12. The copper surface roughness (Ra) was 0.40 μm. The evaluation result regarding the adhesion of the dry film is shown in Table 1. Note that since the adhesion of the dry film resist was not good, <Resist stripping treatment process> was not carried out after that.

Comparative Example 4

<Roughening treatment process> was carried out in a manner similar to that in Example 1, except that an etching solution (the product used in Example 7 of Patent Document 2) was prepared with 4% by mass of hydrogen peroxide, 9% by mass of sulfuric acid, 0.3% by mass of 5-aminotetrazole, 10 ppm of chloride ion and the remaining amount of water. The surface area of the chemical copper plating was 27 [μm$^2$]. The specific surface area was 1.08. The copper surface roughness (Ra) was 0.33 μm. The evaluation result regarding the adhesion of the dry film is shown in Table 1. Note that since the adhesion of the dry film resist was not good, <Resist stripping treatment process> was not carried out after that.

Comparative Example 5

<Roughening treatment process> was carried out in a manner similar to that in Example 1, except that an etching solution (the product used in the Examples of Patent Document 3) was prepared with 1.5% by mass of hydrogen peroxide, 5% by mass of sulfuric acid, 0.3% by mass of benzotriazole, 5 ppm of chloride ion and the remaining amount of water. The surface area of the chemical copper plating was 28 [μm$^2$]. The specific surface area was 1.12. The copper surface roughness (Ra) was 0.36 μm. The evaluation result regarding the adhesion of the dry film is shown in Table 1. Note that since the adhesion of the dry film resist was not good, <Resist stripping treatment process> was not carried out after that.

Comparative Example 6

<Roughening treatment process> was carried out in a manner similar to that in Example 1, except that an etching solution (the product used in Example 1 of Patent Document 4) was prepared with 1% by mass of hydrogen peroxide, 9% by mass of sulfuric acid, 0.1% by mass of tetrazole, 1 ppm of silver ion and the remaining amount of water. The surface area of the chemical copper plating was 28 [μm$^2$]. The specific surface area was 1.12. The copper surface roughness (Ra) was 0.35 μm. The evaluation result regarding the adhesion of the dry film is shown in Table 1. Note that since the adhesion of the dry film resist was not good, <Resist stripping treatment process> was not carried out after that.

Comparative Example 7

<Roughening treatment process> was carried out in a manner similar to that in Example 1, except that an etching solution (the product used in Example 1 of Patent Document 5) was prepared with 5.25% by mass of hydrogen peroxide, 12.5% by mass of sulfuric acid, 0.06% by mass of 5-aminotetrazole, 0.02% by mass of 5-methyltetrazole, 0.4% by mass of 1-hydroxyethane-1,1-diphosphonic acid and the remaining amount of water. The surface area of the chemical copper plating was 27 [μm$^2$]. The specific surface area was 1.08. The copper surface roughness (Ra) was 0.28 μm. The evaluation result regarding the adhesion of the dry film is shown in Table 1. Note that since the adhesion of the dry film resist was not good, <Resist stripping treatment process> was not carried out after that.

TABLE 1

| | Composition | Specific surface area | Ra (μm) | Adhesion |
|---|---|---|---|---|
| Example 1 | 0.3 wt % of hydrogen peroxide<br>1.5 wt % of sulfuric acid<br>0.1 wt % of 5-methyltetrazole<br>1 ppm of chloride ion | 1.52 | 0.17 | E |
| Example 2 | 0.5 wt % of hydrogen peroxide<br>2.5 wt % of sulfuric acid<br>0.05 wt % of 5-aminotetrazole<br>0.05 wt % of 1,5-dimethyltetrazole<br>1 ppm of chloride ion | 1.60 | 0.20 | E |
| Example 3 | 0.4 wt % of hydrogen peroxide<br>2 wt % of sulfuric acid<br>0.05 wt % of 1H-tetrazole<br>0.03 wt % of 5-mercapto-1-methyltetrazole<br>1 ppm of chloride ion | 1.48 | 0.19 | E |
| Example 4 | 0.5 wt % of hydrogen peroxide<br>2.5 wt % of sulfuric acid<br>0.05 wt % of 5-methyltetrazole<br>0.05 wt % of 1,5-dimethyltetrazole<br>3 ppm of bromine ion | 1.56 | 0.20 | E |
| Comparative Example 1 | 0.3 wt % of hydrogen peroxide<br>1.5 wt % of sulfuric acid<br>0.1 wt % of 5-methyltetrazole | 1.08 | 0.22 | P |
| Comparative Example 2 | 0.3 wt % of hydrogen peroxide<br>1.5 wt % of sulfuric acid<br>1 ppm of chloride ion | 1.04 | 0.14 | F |
| Comparative Example 3 | 2 wt % of hydrogen peroxide<br>9 wt % of sulfuric acid<br>0.3 wt % of 5-aminotetrazole<br>0.2 ppm of silver ion<br>0.2 ppm of chloride ion | 1.12 | 0.40 | P |
| Comparative Example 4 | 4 wt % of hydrogen peroxide<br>9 wt % of sulfuric acid<br>0.3 wt % of 5-aminotetrazole<br>10 ppm of chloride ion | 1.08 | 0.33 | P |
| Comparative Example 5 | 1.5 wt % of hydrogen peroxide<br>5 wt % of sulfuric acid<br>0.3 wt % of benzotriazole<br>5 ppm of chloride ion | 1.12 | 0.36 | P |
| Comparative Example 6 | 1 wt % of hydrogen peroxide<br>9 wt % of sulfuric acid<br>0.1 wt % of tetrazole<br>1 ppm of silver ion | 1.12 | 0.35 | P |
| Comparative Example 7 | 5.25 wt % of hydrogen peroxide<br>12.5 wt % of sulfuric acid<br>0.06 wt % of 5-aminotetrazole<br>0.02 wt % of 5-methyltetrazole<br>0.4 wt % of 1-hydroxyethane-1,1-diphosphonic acid | 1.08 | 0.28 | P |

Example 5

A substrate of chemical copper plating (size: 15 cm×15 cm, thickness of plating: 0.5 μm) was subjected to a spray treatment at a liquid temperature of 30° C. and a spray pressure of 0.1 MPa for 30 seconds using an etching solution prepared with 0.4% by mass of hydrogen peroxide, 1.5% by mass of sulfuric acid, 0.05% by mass of 5-methyltetrazole, 0.05% by mass of 1,5-dimethyltetrazole, 1 ppm of chloride ion and the remaining amount of water. The amount of dissolution of copper was calculated from the difference in mass of the substrate before and after the roughening treatment, and it was 0.2 μm.

Next, the copper surface after the roughening treatment was laminated with a dry film resist (Hitachi Chemical Co., Ltd.), and exposure and development were performed. An electrolytic copper plating was provided to an opening after the exposure. Next, the spray treatment was carried out at a liquid temperature of 50° C. and a spray pressure of 0.2 MPa for 3 minutes using a resist stripping liquid prepared with 5% by mass of monoethanolamine, 1% by mass of tetraethylammonium hydroxide, 2% by mass of ethylene glycol monophenyl ether, 0.1% by mass of 5-aminotetrazole and the remaining amount of water to strip the resist. Observation was carried out using a metallographic microscope (Olympus Corporation, MX61L) (200×), and it was confirmed that the resist was completely stripped and removed. Further, the surface of the copper wiring of the conductor was observed using the metallographic microscope, and no copper corrosion (e.g., a pinhole) was seen.

Figure 4:
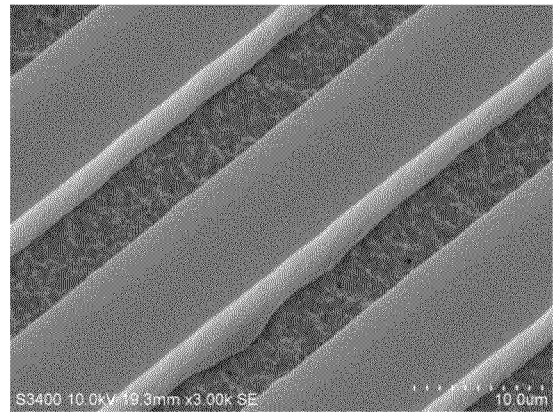
FIG. 4 is an electron microscope photograph of the wiring pattern of Example 5 (3,000×).

An electron microscope photograph of the obtained wiring pattern (3,000×) is shown in FIG. 4.

Example 6

The process was carried out in a manner similar to that in Example 5, except that a resist stripping liquid was prepared with 8% by mass of monoethanolamine, 1% by mass of tetraethylammonium hydroxide, 5% by mass of diethylene glycol monophenyl ether, 0.1% by mass of 1,2,4-triazole and the remaining amount of water. The evaluation result regarding the dry film stripping property is shown in Table 2.

Comparative Example 8

The process was carried out in a manner similar to that in Example 5, except that a resist stripping liquid (the product used in Example 1 of Patent Document 6) was prepared with 1% by mass of tetraethylammonium hydroxide, 8% by mass of monoethanolamine, 0.5% by mass of hydroxylamine, 0.1% by mass of 1-methyl-1H-benzotriazol and the remaining amount of water. The evaluation result regarding the dry film stripping property is shown in Table 2.

Figure 5:
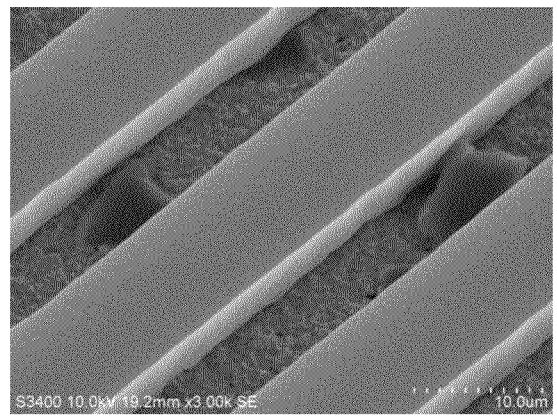
FIG. 5 is an electron microscope photograph of the wiring pattern of Comparative Example 8 (3,000×).

An electron microscope photograph of the obtained wiring pattern (3,000×) is shown in FIG. 5.

Comparative Example 9

The process was carried out in a manner similar to that in Example 5, except that a resist stripping liquid (the product used in Example 4 of Patent Document 7) was prepared with 1% by mass of ammonium fluoride, 0.1% by mass of monoethanolamine, 67.9% by mass of N,N-dimethylacetamide, 3% by mass of epoxy polyamide and the remaining amount of water. The evaluation result regarding the dry film stripping property is shown in Table 2.

Comparative Example 10

The process was carried out in a manner similar to that in Example 5, except that a resist stripping liquid (the product used in Example 1 of Patent Document 8) was prepared with 10% by mass of monoethanolamine, 10% by mass of N,N-diethylhydroxylamine, 30% by mass of diethylene glycol monobutyl ether, 10% by mass of D-sorbitol and the remaining amount of water. The evaluation result regarding the dry film stripping property is shown in Table 2.

TABLE 2

| | Composition | Stripping property | Copper corrosion (visual observation) |
|---|---|---|---|
| Example 1 | 5 wt % of monoethanolamine<br>1 wt % of tetramethylammonium hydroxide<br>2 wt % of ethylene glycol monophenyl ether<br>0.1 wt % of 5-aminotetrazole | Good | No corrosion |
| Example 2 | 5 wt % of monoethanolamine<br>1 wt % of tetramethylammonium hydroxide<br>2 wt % of ethylene glycol monophenyl ether<br>0.1 wt % of 5-aminotetrazole | Good | No corrosion |
| Example 3 | 5 wt % of monoethanolamine<br>1 wt % of tetramethylammonium hydroxide<br>2 wt % of ethylene glycol monophenyl ether<br>0.1 wt % of 5-aminotetrazole | Good | No corrosion |
| Example 4 | 5 wt % of monoethanolamine<br>1 wt % of tetramethylammonium hydroxide<br>2 wt % of ethylene glycol monophenyl ether<br>0.1 wt % of 5-aminotetrazole | Good | No corrosion |
| Example 5 | 5 wt % of monoethanolamine<br>1 wt % of tetraethylammonium hydroxide<br>2 wt % of ethylene glycol monophenyl ether<br>0.1 wt % of 5-aminotetrazole | Good | No corrosion |
| Example 6 | 8 wt % of monoethanolamine<br>1 wt % of tetraethylammonium hydroxide<br>5 wt % of diethylene glycol monophenyl ether<br>0.1 wt % of 1,2,4-triazole | Good | No corrosion |
| Comparative Example 8 | 8 wt % of monoethanolamine<br>1 wt % of tetramethylammonium hydroxide<br>0.5 wt % of hydroxylamine<br>0.1 wt % of 1-methyl-1H-benzotriazol | Residue existed | No corrosion |

TABLE 2-continued

| | Composition | Stripping property | Copper corrosion (visual observation) |
|---|---|---|---|
| Comparative Example 9 | 1 wt % of ammonium fluoride<br>0.1 wt % of monoethanolamine<br>67.9 wt % of N,N-dimethylacetamide<br>3 wt % of epoxy polyamide | Residue existed | No corrosion |
| Comparative Example 10 | 10 wt % of monoethanolamine<br>10 wt % of N,N-diethylhydroxylamine<br>30 wt % of diethylene glycol monobutyl ether<br>10 wt % of D-sorbitol | Residue existed | No corrosion |

INDUSTRIAL APPLICABILITY

It is understood from the results in Tables 1 and 2 that the adhesion between the chemical copper surface and the dry film resist is improved by the treatment with the specific etching solution to be used in the present invention, and that the dry film resist can be stripped without residue when using the specific resist stripping liquid to be used in the present invention.

EXPLANATIONS OF LETTERS OR NUMERALS

1: core (insulation layer)
2: copper wiring
3: insulation layer
4: chemical copper plating
5: dry film resist
6: opening
7: electrolytic copper plating

The invention claimed is:

1. A method for producing a printed-wiring board in a semi-additive process, comprising:
    providing a chemical copper plating on an insulation layer or forming a copper thin film as a seed layer on the insulation layer using a sputtering method;
    subjecting a surface of the chemical copper plating or a surface of the copper thin film to a roughening treatment using an etching solution containing 0.1 to 3% by mass of hydrogen peroxide, 0.3 to 5% by mass of sulfuric acid, 0.1 to 3 ppm of halogen ion and 0.003 to 0.3% by mass of tetrazoles;
    attaching a dry film resist to the surface of the chemical copper plating or the surface of the copper thin film after the roughening treatment to perform exposure and development and providing an electrolytic copper plating to an opening after the exposure; and
    subjecting the remaining dry film resist to a stripping treatment using a resist stripping liquid containing 0.5 to 20% by mass of monoethanolamine, 0.2 to 10% by mass of quaternary ammonium hydroxide, 0.01 to 10% by mass of ethylene glycols and 0.01 to 0.5% by mass of azoles,
    wherein a copper surface roughness (Ra) before and after the roughening treatment is 0.1 to 0.3 μm with the proviso that the value of the copper surface roughness is measured by using a scanning tunneling microscope (30,000×).

2. The method for producing a printed-wiring board according to claim 1, wherein a specific surface area of the copper surface after the roughening treatment is 1.2 to 2.0 with the proviso that the specific surface area of the copper surface is an surface area of the copper surface per an unit area of 5 μm×5 μm and the value of the area is measured by using a scanning tunneling microscope (30,000×).

3. The method for producing a printed-wiring board according to claim 1, wherein the tetrazoles in the etching solution are at least one selected from the group consisting of 1H-tetrazole, 1-methyltetrazole, 5-methyltetrazole, 5-aminotetrazole, 5-mercapto-1-methyltetrazole and 1,5-dimethyltetrazole.

4. The method for producing a printed-wiring board according to claim 1, wherein the quaternary ammonium hydroxide in the resist stripping liquid is at least one selected from the group consisting of tetramethylammonium hydroxide, tetraethylammonium hydroxide and trimethyl(2-hydroxyethyl)ammonium hydroxide.

5. The method for producing a printed-wiring board according to claim 1, wherein the ethylene glycols in the resist stripping liquid are at least one selected from the group consisting of ethylene glycol monophenyl ether and diethylene glycol monophenyl ether.

6. The method for producing a printed-wiring board according to claim 1, wherein the azoles in the resist stripping liquid are at least one selected from the group consisting of 5-aminotetrazole and 1,2,4-triazole.

* * * * *